United States Patent
Edwards et al.

(10) Patent No.: US 7,111,274 B1
(45) Date of Patent: Sep. 19, 2006

(54) SCHEDULING HARDWARE GENERATED BY HIGH LEVEL LANGUAGE COMPILATION TO PRESERVE FUNCTIONALITY OF SOURCE CODE DESIGN IMPLEMENTATIONS

(75) Inventors: Stephen G. Edwards, Woodbine, MD (US); Donald J. Davis, Ellicott City, MD (US); Jonathan C. Harris, Ellicott City, MD (US); Andreas B. Kollegger, Baltimore, MD (US); Ian D. Miller, Charlotte, NC (US); Christopher R. S. Schanck, Marriottsville, MD (US); Yung-Sheng Yu, Columbia, MD (US)

(73) Assignee: Xilinx, Inc., San Jose, CA (US)

( * ) Notice: Subject to any disclaimer, the term of this patent is extended or adjusted under 35 U.S.C. 154(b) by 751 days.

(21) Appl. No.: 10/310,260

(22) Filed: Dec. 4, 2002

(51) Int. Cl.
*G06F 17/50* (2006.01)
(52) U.S. Cl. .............................. 716/18; 716/11; 716/6
(58) Field of Classification Search ................. 716/18, 716/1, 2, 6
See application file for complete search history.

(56) References Cited

U.S. PATENT DOCUMENTS 6,044,211 A * 3/2000 Jain ............................ 716/18

OTHER PUBLICATIONS

U.S. Appl. No. 10/310,336, filed Dec. 4, 2002, Edwards et al.
U.S. Appl. No. 10/310,362, filed Dec. 4, 2002, Edwards et al.
U.S. Appl. No. 10/310,520, filed Dec. 4, 2002, Miller et al.

* cited by examiner

Primary Examiner—Thuan Do
(74) Attorney, Agent, or Firm—Pablo Meles; LeRoy D. Maunu

(57) ABSTRACT

A method of processing a general-purpose, high level language program to determine a hardware representation of the program can include compiling the general-purpose, high level language program to generate a language independent model (100) and identifying data input to each component specified in the language independent model to determine a latency for each component (220, 225). The components of the language independent model can be annotated for generation of control signals such that each component is activated when both control and valid data arrive at the component (230). Each component also can be annotated with an output latency derived from a latency of a control signal for the component and a latency determined from execution of the component itself (235).

22 Claims, 1 Drawing Sheet

SCHEDULING HARDWARE GENERATED BY HIGH LEVEL LANGUAGE COMPILATION TO PRESERVE FUNCTIONALITY OF SOURCE CODE DESIGN IMPLEMENTATIONS

BACKGROUND OF THE INVENTION

1. Field of the Invention

The present invention relates to the field of hardware design and, more particularly, to generating a hardware description from a general-purpose, high level programming language.

2. Description of the Related Art

The design of field programmable gate arrays (FPGAs) or application specific integrated circuits (ASICs) typically begins with the development and validation of an algorithm which the integrated circuit (IC) is intended to implement. Presently, developers validate algorithmic designs by implementing algorithms in a high level programming language such as C, C++, Java, or the like. High level programming languages provide designers with the ability to rapidly prototype an algorithm, explore the algorithm in further detail, and ultimately prove or validate that the algorithm can sufficiently process the data for which the algorithm and the IC are being developed.

Once an algorithm has been validated, the designer can begin the process of transforming the high level language design into a hardware description implementation using VERILOG, VHDL, or some other hardware description language alternative. Presently, this transformation is performed manually by designers. As a result, the process can be very time intensive and error prone. Transformation of a high level language design to a hardware description language implementation involves tracking an extraordinary number of inter-relationships between timing signals and data. The designer must think in terms of clock cycles and relative timing between signals in the hardware description language. State machines must be designed that are capable of correctly moving data through the hardware description language code, and which are capable of enabling the correct subsystems at the proper times.

Attempts have been made to develop improved tools to aid in the transition from a high level language design to a hardware description language design. For example, specialized programming languages such as Handel-C and SystemC are enhanced programming languages that, when compiled, can produce a hardware description conforming to a particular hardware description language specification such as VERILOG or VHDL. Specialized programming languages such as these, however, are "hardware aware" in that the languages include significant enhancements in the way of standard libraries and extensions which allow programs written in these languages to be compiled into suitable hardware descriptions.

Handel-C, SystemC, and other "hardware aware" languages rely on a technique known as progressive elaboration. Under the technique of progressive elaboration, a designer codes a design in a high level language. After initial algorithmic verification, the designer successively adds more information and/or hardware aware constructs to the code to direct the compiler in terms of implementation. A final design is achieved by adding sufficient information to the source code to generate the desired results.

While "hardware aware" languages do help to ease the translation of validated algorithms to hardware description language designs, there are disadvantages to the use of specialized languages. One such disadvantage is the time required for developers to familiarize themselves with a different special purpose language. Although "hardware aware" languages typically are rooted in a known high level language such as the C programming language, developers still must learn special enhancements and additions to the language which make the generation of a hardware description language output possible.

Another disadvantage of specialized "hardware aware" languages can be the cost associated with purchasing the language as a design tool. The acquisition of a specialized language as a design tool adds yet another expense to the IC development process. Finally, "hardware aware" design tools which rely upon progressive elaboration design techniques require source code modifications to work properly.

Accordingly, a need exists in the electronics industry for an efficient way of capturing design functionality in a more abstract manner than is presently available with conventional hardware description languages.

SUMMARY OF THE INVENTION

The invention disclosed herein provides a method and apparatus for scheduling hardware which is generated from a program written in a general-purpose, high level programming language. In particular, the present invention can compile general-purpose, high level language source code of a program into a language independent model (LIM), which can be analyzed to perform one or more optimization techniques with regard to scheduling the design.

One aspect of the present invention can include a method of processing a general-purpose, high level language program to determine a hardware representation of the program. The method can include compiling the general-purpose, high level language program to generate a LIM and examining execution characteristics of each component specified in the language independent model to determine a latency for each component.

The components of the LIM can be annotated to indicate the generation of control signals such that each component is activated when both control and valid data arrive at the component. Each component also can be annotated with an output latency derived from a latency of a control signal for the component and a latency determined from execution of the component itself. The output latency of a component can be derived from the enable signal and the execution latency of the component, where the enable signal depends on the merging of the control input and the data input of the component. A hardware description language representation from the LIM then can be generated.

The LIM can be processed to apply one or more optimizations. According to one embodiment of the invention, multiple copies of a structure of one or more components which can be re-used over multiple clock cycles can be identified within the LIM as a shared resource. At least one copy of the shared resource can be eliminated and the remaining copies of the shared resource can be annotated such that control signals and data signals to other components which interact with the copies of the shared resource can be generated. The method also can include determining whether a conflict exists between one or more other LIM structures which access the shared resource. If so, the conflict can be reconciled by inserting a register structure or by inserting an arbitration logic structure into the LIM to regulate access to the shared resource.

According to another embodiment of the present invention, loop structures of one or more components within the LIM can be identified as candidates for over-clocking or multi-clocking. The identified loop structures can be over-clocked or multi-clocked. A synchronization structure can be added within the LIM at the input and output of the over-clocked or multi-clocked structure.

Additionally, the method can include identifying a functional group of components in the LIM which require at least a minimum area for hardware implementation or have a low throughput. The group of components can be designated for implementation as an embedded processor. An interface structure formed of one or more components can be added to the LIM through which other components can interact with the embedded processor.

The LIM can be balanced by including additional structures within the LIM such that each data and control path through the LIM requires a same number of clock cycles. The LIM also can be pipelined. For example, according to one embodiment of the present invention, a complexity value can be assigned to at least one component in the LIM. A complexity value then can be determined for component sequences between isolating structures of the LIM such as flip-flops and/or registers. For any sequences having a complexity value above a minimum value, an additional isolating structure can be inserted into the component sequence.

According to yet another embodiment of the present invention, a target latency for the LIM can be assigned. Complexity values can be assigned to the components in the LIM and a complexity value for component sequences between isolating structures of the LIM can be determined. Accordingly, a number of zones within the LIM equal to at least the target latency plus one can be defined. The zones can be determined such that each zone has approximately the same level of complexity as any other zone and such that control flows through each of the zones. Isolating structures such as flip-flops or registers can be inserted between each zone to achieve the target latency.

BRIEF DESCRIPTION OF THE DRAWINGS

There are shown in the drawings embodiments which are presently preferred, it being understood, however, that the invention is not limited to the precise arrangements and instrumentalities shown.

DETAILED DESCRIPTION OF THE INVENTION

Figure 1:
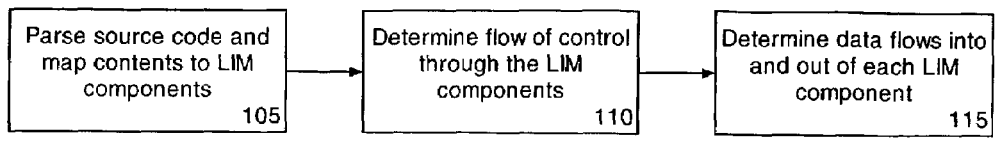
FIG. 1 is a flow chart illustrating a method of determining a language independent model for use with the present invention.

The invention disclosed herein provides a method and apparatus for scheduling hardware which is generated from a program written in a general-purpose, high level programming language. In particular, the present invention can compile general-purpose, high level language source code of a program into a language independent model (LIM). The LIM can be analyzed, or compiled, and one or more optimization techniques can be applied with regard to scheduling the design. Any scheduling information can be annotated or applied to the LIM. In consequence, more efficient hardware descriptions or programmatic hardware representations can be generated from the resulting LIM.

The present invention utilizes a LIM which is a programming language neutral and hardware neutral representation of a program and the program structure. Generally, the source code of a program can be mapped to the LIM automatically using a compiler configured as disclosed herein. From the LIM, a hardware description language specification can be derived automatically. The LIM is based upon the premise that many general-purpose, high level programming languages share a similar if not equivalent set of basic programming constructs for expressing logic. These basic programming constructs can include operations, whether arithmetic, logical, and/or bitwise, sequences, branches, loops, memory assignments and references, compound statements, and subroutine calls. Notably, in cases where more complex programming constructs exist, the complex programming constructs typically can be reduced to a set of equivalent primitive or less complex programming constructs. The LIM provides a hierarchical, abstract representation of these programming constructs.

The LIM is formed of a collection of components, wherein each component refers to a unit of functionality. The component can be a primitive, which refers to a low level "black box", or a module which refers to a container or collection of other components. Each component of the LIM can have one or more attributes which describe how that component relates to other components of the LIM. For example, component attributes can specify any external data values which the component requires in order to perform a function. The specified data values must be provided as inputs to the component by the components that produce the values. Component attributes also can specify any data values which the component produces for external consumption. The component can provide these data values as execution output, which in turn can be provided as input to other components of the LIM. Component attributes further can specify the order of execution of components in the LIM. Still, the examples disclosed herein are provided for purposes of illustration, and as such, are not intended to be an exhaustive listing of possible component attributes. In any case, the component attributes can be derived from a straightforward semantic analysis of program source code.

Notably, as a module is itself a component, components in the LIM can be hierarchically nested to an arbitrary depth. Different types of modules can exist which represent or correspond to different programming constructs. For example, common module types can include block modules, branch modules, and loop modules. A block module represents an ordered sequence of components. A branch module specifies the execution of one component or another based upon the value of a component which computes a conditional value. A loop module executes a body component iteratively until a conditional component produces a termination condition.

FIG. 1 is a flow chart illustrating a method 100 of deriving a LIM in accordance with the inventive arrangements disclosed herein. The method 100 can begin in step 105 by parsing the source code of a general-purpose, high level language program. The source code can be parsed into a hierarchy of LIM components. For example, the source code can be parsed with a grammar based parser, a step which typically is performed when compiling source code. The parser can produce a parse tree, which can be analyzed to determine the parse tree contents. Rather than generating assembly code, each syntactic construct can be mapped to one or more LIM components. For instance, an "if" statement can cause a branch component to be produced, which in turn may become a component in a higher level module. In this manner, the LIM description can be built from low to high level constructs.

In step 110, the flow of control through the various components of the LIM can be determined. Each module can specify the flow of control through its constituent components. For example, the logical order in which the various components of the LIM are to execute can be defined. Flow of control can be classified as software control flow or hardware control flow. For most modules, the two classifications are equivalent. For block modules, however, the meaning of software and hardware control flow diverge. Software control flow for a block module indicates that the constituent components within the block module execute one at a time in a sequential manner. Hardware control flow for a block module indicates that each component can begin execution in parallel. A block module can maintain both descriptions. A module can be said to have completed execution when all of the constituent components of the module have completed execution.

In step 115, the data flow into and out of each of the LIM components can be determined. By following the software flow of control through the LIM, the flow of data into and out of each component and module can be charted. Data flow can be represented by the annotation of data dependency information on each component. A data dependency indicates the source of a data value that is needed by a component before that component can begin execution. For each data value required by a component, a separate data dependency exists, and therefore, can be recorded for each different control flow path leading to the component. Using the type information obtained from the source code, each data flow also can be annotated with size information, a static initial value if one exists, and a type.

Data flows into and out of non-local storage, for example the heap rather than the stack, also can be recorded. This allows a picture of the global storage to be modeled. The global storage can be transformed into registers and memory banks in the hardware implementation. At this point, if desired, the design efficiency can be improved by replicating shared memory structures, replicating loop structures to eliminate potential data bottlenecks, and inlining memory accesses.

Once the LIM has been generated, the LIM can be scheduled. For example, the LIM can be annotated to specify the physical connections between individual components and modules by a scheduling component of the compiler. The LIM is annotated with information specifying the actual wire connections as well as any additional hardware such as registers, arbitration logic, and/or interfaces which may be needed to preserve the semantics of the LIM as compared to the original source code, which will translate into an accurate hardware implementation of the source code.

The connections between each component of the LIM, or the annotated connection data of the components which specifies the physical connections, must satisfy the data dependencies and control constraints of the LIM. More particularly, each component can be activated when both of the following conditions are met: (1) the flow of control reaches the component, and (2) all of the data inputs to the component are available. As noted, in order to meet these requirements, additional structures which represent hardware components such as latches or registers for the data inputs, and flip-flops, "AND", or "OR" gates for the control signal may need to be inserted into the LIM. The scheduling process can proceed in a bottom-up fashion beginning with the lowest level components.

The scheduling process is run on a module by module basis such that the inputs of each module are assumed to be at time zero. Components within modules are scheduled only relative to other components in that module. Then, at the next hierarchical level up, that module is scheduled like any other component. Since the inputs of the module will be scheduled to guarantee validity, the scheduling criteria assumed when scheduling the components of that module will be true. If, due to a shared resource, a component in that module must execute after a component in another module, then those two modules can be scheduled to execute one after the other.

During the scheduling process, one or more optimization techniques can be applied to the LIM. For example, during the scheduling process, the LIM can be balanced and/or pipelined. Balancing refers to the addition of registers into the data and/or control paths in an effort to make each data and control path through the LIM require the same number of clock cycles from beginning to end. Pipelining refers to the inclusion of registers into the data paths of the LIM to reduce the length of combinational logic paths and increase the effective frequency of the resulting design. Balancing and pipelining, in combination, can allow a design to process a new set of inputs each clock cycle. More particularly, balancing improves the rate at which data can be fed into the design up to the ideal maximum of one data set every clock cycle. Implicit feedback, loops, shared resources, and the like can effectively increase the number of cycles between data sets. Pipelining improves the operational frequency of the design. In conjunction, balancing and pipelining serve to increase the data throughput rate of the circuit.

Figure 2:
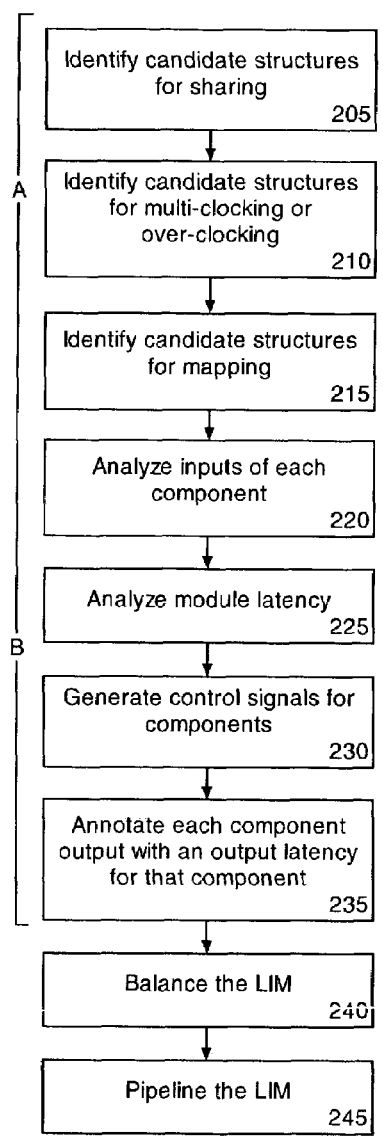
FIG. 2 is a flow chart illustrating a method of scheduling a language independent model according to the present invention.

FIG. 2 is a flow chart illustrating a method 200 of scheduling a language independent model according to the present invention. Steps 205, 210, and 215, taken collectively and referred to as section A, illustrate different steps which can be taken for purposes of optimizing the resulting hardware language representation of the LIM. Beginning with section A, the LIM can be traversed to identify or annotate various structures. In step 205, structures can be identified for sharing. For example, multiple copies of structures formed of one or more components can be identified within the LIM as shared resources. One or more of the shared resource copies can be eliminated from the LIM such that a single copy of the structure, or at least fewer copies of the structure than originally specified, are utilized by more than one accessing component and/or module, so long as any identified conflicts are properly scheduled and/or resolved.

Other criteria for identifying components for sharing can include the size of a portion of a circuit as well as sharing predetermined high performance components such as multipliers, memories, shift registers, and the like. For example, some hardware designs utilize a specific maximum number of dedicated multipliers or other high performance components on a single chip. Exceeding this number can result in low performance components. Thus, sharing such resources can be advantageous.

Shared resources can include methods or any other hardware functionality which is defined by a subroutine or a method, operators such as large multipliers, and memory elements in the case that object lifetimes do not overlap. Accordingly, resources in the LIM that have been identified for sharing can be refused over multiple clock cycles and can be scheduled such that new data elements can be provided during different clock cycles. Results from the shared resource can be distributed back to the appropriate data consumers or accessing structures.

For example, for given a design that has two instances of the same class or two instances of a given data structure, the memory allocated for the first instance can be used for the second instance. This sharing can be performed when the object lifetimes do not overlap. The lifetime is defined as the cumulative total of all accesses, read and write, to all locations of each instance. If the LIM can be analyzed to determine that the last access of the first instance will occur before the first access by the second instance, then the same memory locations can be used for both instances. Additional logic may need to be inserted to guarantee correct initial conditions for the second instance.

Beginning with step 210, expensive structures within the LIM can be annotated or identified. As used herein, the term "expensive structures" refers to components and/or modules that require more than a predefined area for an equivalent physical hardware implementation, require more than a predefined number of clock cycles to execute, or simply be designated as expensive due to the limited availability of particular resources in the target technology.

The maximum area parameters and clock cycle parameters can be specified, for example, within a user or system profile that is accessible by the compiler or can be specified as a configurable setting within the compiler itself. Thus, a component and/or module which requires more than the maximum number of clock cycles to execute can be identified or annotated as an expensive structure for further processing. Notably, different maximum clock cycle values can be set independently for different components, modules, and/or groups of components and modules within the LIM. Regarding area determinations, as structures within the LIM can be translated into equivalent hardware structures, and such hardware structures can be placed or apportioned using defined circuit layout rules, the area that would be required to implement each component, module, and/or component and module combination can be calculated. Accordingly, the minimal area also can be specified for individual components, modules, and component/module combinations.

Accordingly, in step 210, structures within the LIM can be identified as candidates for multi-clocking, that is including a different clock within the design, or over-clocking by referencing a multiple of an existing clock frequency. More particularly, loop structures within the LIM can be identified and compared with the maximum clock cycle parameters. If any loop structures require more than the specified maximum clock cycle parameters, those structures can be flagged or annotated as candidates for multi-clocking or over-clocking. Gains in performance can be realized by increasing the clock frequency for a loop. For example, if a clock frequency is doubled for a particular loop, the loop can finish execution in one-half of the time required had the clock frequency not been increased. Loops also can be identified as candidates for multi-clocking or over-clocking if those loops limit data throughput of the design.

In step 215, structures within the LIM can be identified as candidates for mapping. More particularly, components, modules, or functional units which are combinations of both components and modules within the LIM which would require more than the maximum area for implementation as hardware can be identified or annotated for implementation as an embedded processor.

In illustration, a particular functional unit of source code represented in the LIM can require more complex hardware structures for implementation. For example, a sequence of multiply and divide operations in software translates into a complex hardware structure, one that requires a significant amount of circuit area. Accordingly, various functional sections of the LIM can be designated for implementation using software executing within an embedded processor to be included in the design. Accordingly, designated portions of the LIM can be left as bytecode or opcodes that can be executed by an embedded processor. Thus, any components and/or modules which are data suppliers to the designated area to be implemented as a processor or are data consumers of the designated area can be identified so that suitable interface structures can be included within the LIM.

Steps 220 through 235 of the method 200 illustrate the basic scheduling process performed by the present invention which converts data dependencies between structures of the LIM to connections. In step 220, each component of the LIM can be analyzed with respect to the inputs being provided to that component. For example, information such as which data is required for the component to execute as well as under what conditions control arrives to the component can be determined. The latency of each component, that is the number of clock cycles required for the component to execute can be determined.

In step 225, having analyzed the individual components, the module latencies can be determined. A baseline time reference of 0 can be assigned to each input of each module, wherein all inputs to the modules are assumed to be valid. If the combinational logic of the module includes no registers and derives input directly from the module input, the combinational logic is assumed to have no latency. For example, a result is rendered by the combinational logic at reference time 0. Any components within the module which require one or more clock cycles to execute can be annotated that at time 1, or after the appropriate number of clock cycles has passed since that component received input data, output data is available. Accordingly, the latency of each module can be calculated by summing the number of cycles needed for data to propagate through the module. Exemplary structures which can require clock cycles for execution can include registers which store data, memory accesses, as well as pipelined and/or balanced structures.

The latencies of the modules can be specified as fixed latencies which specify a particular number of clock cycles for execution to complete. Latencies also can be specified as a bounded range of clock cycles. Still, latencies can be specified as dependent quantities. For example, a latency can be specified as "N" cycles after the module has been enabled. Still, latencies can be specified as unbounded, for example as 0 or more, or 5 or more, etc. This situation can arise in the case of arbitrated resources where an access may be staved off for multiple clock cycles while other components access the resource.

In step 230, control signals can be generated for each component. A control signal can be generated for each component to activate execution in that component. Control can be the logical "AND" of (1) the control path reaching the component according to an analysis of the branching and logic of the LIM, and (2), all data inputs to the structure being available, that is having arrived, and being valid. Data can be considered valid when the data source component has been enabled and has completed execution.

If data inputs arrive, or the possibility exists that data inputs can arrive before a control path is determined, the data input can be latched. Alternatively, if control arrives prior to the data, the control signal can be delayed until the data has arrived, for example by including an additional register structure in the path in the LIM. If control signals and data occur over a period of more than one clock cycle, that is not all inputs are asserted during the same clock cycle, then a structure representing a scoreboard circuit can be incorporated into the LIM to create a logical "AND" over multiple clock signals. The scoreboard circuit structure ensures that each input has been activated once before activating output of the scoreboard circuit.

A scoreboard circuit, however, need only be inserted when the data and control arrives over multiple clock cycles and one or more of the input signals cannot be determined to be later than all the other input signals. For example, in the case where an input has a latency of 5 and another input has an unbounded latency of 3 or more, the possibility exists that either signal can arrive before the other. Accordingly, data associated with either signal can be latched and the two signals can be "scoreboarded" together to generate an enable signal.

The number of copies of shared resources, whether operations or sections of logic, previously identified as shared resources within the LIM can be reduced. That is, one or more copies of the shared resource can be eliminated from the LIM. The multiple uses of shared resources by different components and/or modules can be scheduled so as to not overlap in time (clock cycles). This reduces the overall size of the implementation while maintaining functionality.

Remaining copies of the shared resources of the LIM can be annotated with control signal data and appropriate connections. More particularly, control signals can be generated to enable the shared resources for access by data providers as well as to provide "done" signals back to any data consumers of the shared resources. Data connections between shared resources and data providers and consumers also can be annotated.

When connecting data and control flows to a shared resource, the data and control flows can be multiplexed to guarantee that valid data sets are applied to the resource. The control signals are logically "OR'd" together to generate an enable signal to the shared resource. The data signals are multiplexed such that the enable signal for each data selects that data to be applied to the resource. The arbitration logic and/or scheduling can guarantee that only one control signal enables the shared resource at a time.

The shared resources can be scheduled with respect to any latencies of other accessing resources. If no contention exists for the shared resource, or resources, then no action need be taken. It may be necessary, however, to include additional registers to delay data and/or control, or insert structures in the LIM which represent arbitration logic to ensure that accessing resources are provided with timely access to the shared resource.

Resources identified as candidates for over-clocking or multi-clocking, i.e. those resources identified as requiring more than a specified number of clock cycles to execute, for example a loop body with high latency, can be over-clocked or multi-clocked as the case may be. Use of over-clocking or multi-clocking can be specified by a user profile, system profile, or by the LIM design itself, for example, whether the LIM includes more than one clock source. Any necessary interface structures can be added to the input and output of the over-clocked or multi-clocked resource to synchronize the resource with other portions of the LIM which operate at different frequencies.

Over-clocking and/or multi-clocking is specified in the LIM by connecting the appropriate clock signal to the clock input of a given module. The clock rates on either side of the boundaries of that module are analyzed and the correct synchronization logic is inserted. If the two clock signals are truly asynchronous, then a "double-flop" is inserted to protect data against metastability. If the two clock signals are synchronous, then a simple latch circuit may be inserted if required. Enable signals can be handled in the same manner as data signals.

Any regions of the LIM which were designated for implementation as an embedded processor can be equipped with necessary interface and control structures. More particularly, the LIM can be annotated to reflect data paths flowing into and out of the embedded processor portion of the LIM to any data supplying and/or consuming structures. Input and output structures representing registers can be inserted as well as a structure representing a data bus if required. The interface structure can be annotated for control signals to selectively enable the embedded processor when input data is ready and to allow the processor to signal a done condition to any data consuming components signifying that data is ready.

In step 235, each output bus can be annotated with an output latency. The output latency for each bus, or data output, whether from a component or a module of the LIM, can be calculated as the latency of the calculated enable signal plus the latency of the component itself. Most components have a 0 combinational logic latency such that the components require little execution time. Such components can be annotated with a 0 indicating that the components execute in less than one clock cycle and indicating that execution is nearly instantaneous. Others, for example memory accesses, may have latencies greater than 0, requiring one or more clock cycles for execution. These components or structures can be annotated with the number of clock cycles required for execution. Scheduling can correctly handle components with any latency, whether fixed or unbounded.

In step 240, the LIM can be balanced. Balanced scheduling of the LIM, as compared to default scheduling, also called minimum area scheduling, refers to the inclusion of additional flip-flops and registers into a design to ensure that every data and control path through the LIM takes exactly the same number of cycles. Balancing ensures that at each component, every path to every input takes exactly the same number of clock cycles. Accordingly, the LIM can be traversed from inputs to outputs to determine the number of clock cycles for the various data and control paths. Additional registers and/or flip-flops can be inserted within the data and control paths as needed.

Although feedback precludes fully balancing the design, if a loop is bounded, then the loop can be treated as an atomic element with a known latency that is equal to the number of iterations multiplied by the number of cycles per iteration. The design can be balanced around the loop. This leads to a design which cannot accept data every cycle, but rather every "N" cycles which may still be better than the design without any level of balanced scheduling.

In step 245, the LIM can be pipelined. Pipelining refers to the insertion of additional registers within long paths of combinational logic. In determining where to insert registers, several different criteria can be applied. The first criterion can be the complexity of the data path being analyzed. Each component in the LIM can be assigned a complexity value indicating the relative speed in which the component executes, or processes data.

The complexity value provides an indication of relative speed of a component for those cases in which the component executes in less than one clock signal, e.g. has a latency of 0. Accordingly, combinational logic paths can be analyzed to calculate a total complexity, the sum of complexities of the constituent components of the path. The complexity can be measured from one register or clocked component to another, and therefore, is useful in evaluating the length of a combinational logic path to ensure that data remains synchronized through the path.

The LIM can be traversed to compute the cumulative depth or complexity of combinational logic paths. Sequential elements such as flip-flops and/or registers break combinational logic paths and re-set the cumulative complexity to 0. Any component whose complexity, when added to the cumulative complexity on any input, exceeds a maximum specified complexity can have that input registered to break the path. Notably, scheduling and balancing can be performed again to ensure that functionality is preserved.

In illustration, a combinational logic chain may include an addition component followed by a multiplication component. This structure can repeat two additional times. If each addition component has a complexity of 3 representing the relative execution time of the addition component, and each multiplication component has a complexity of 100, representing the relative execution time for the multiplication component, then the total complexity of the logic chain of three sets of an addition component followed by a multiplication component is 309. One or more maximum complexity levels can be assigned within a user or system profile. Accordingly, the LIM can be examined for combinational logic paths with complexities that are greater than the specified maximum complexity.

Thus, if the maximum complexity is set to 206, the aforementioned combinational logic path can be identified as exceeding the allowable circuit complexity. Accordingly, a register can be inserted into the combinational logic path, for example following the second set of addition and multiplication components. The combinational logic path is effectively broken into two combinational logic paths, the first having a complexity of 206, and the second having a complexity of 103. Insertion of a clocked component into a combinational logic path ensures that data remains in sync as it moves through the path. In consequence, the circuit can be run at a higher clock rate than would otherwise be possible.

Another aspect of pipelining the LIM can include the inclusion of registers to achieve a desired latency for the LIM. In particular, the LIM can be traversed and subdivided into "N" zones, where "N" is equivalent to the target latency +1. Zones can be determined by analyzing the control flow through the LIM and following several guidelines. First, control must flow through each determined zone. Second, each path through each zone should include approximately the same amount of logic in terms of circuit complexity as any other path through any other zone. Registers can be inserted between each zone to achieve the target latency.

This technique allows the user to specify the number of clock cycles in which the design is to complete without specifying or putting restrictions upon the number of registers to be included. As the LIM is subdivided into a number of zones equivalent to the latency +1, registers or flip-flops can be inserted between the zones thereby causing the circuit to execute in the desired number of clock cycles. Because memory accesses generally take one clock cycle, if memory is accessed, scheduling can be performed again. The data path from the memory can be annotated with a latency of 1. The output of the memory access can be provided directly to the data consuming component without a register being inserted as the memory access component already includes a register.

Pipelining can be performed with reference to additional guidelines as well. For example, the insertion of structures within the LIM that represent registers and/or flip-flops can be limited with regard to power limitations which can be specified within a profile. Using a standard library of parameters for the components of the LIM, power calculations can be performed such that the user is warned that the LIM will exceed the power restrictions for that design. The profile also can specify a desired or maximum number of registers to be used in the design as a criteria for pipelining.

Another guideline that can improve the performance of the resulting hardware implementation of the LIM is to restrict the insertion of pipeline registers into any feedback paths within the LIM. The insertion of structures within a feedback path adds additional cycles to the path thereby reducing the overall data throughput of an implementation. Feedback paths can include any loop constructs within the LIM.

Implicit feedback paths can exist between accesses to the same memory and/or storage structures, for example a write to a field at the top of a method and a subsequent read of the element later. The field cannot be rewritten until the read occurs. This situation can be fixed by pipelining the written value to the read location. Taking another example, however, where a read from a field occurs at the top of a loop and the write occurs later in the loop, the read at the top cannot occur within the second pass until the write has occurred from the first pass. This situation cannot be fixed by pipelining, and therefore, represents a true implicit feedback point.

Balanced scheduling in combination with pipelining allows a design to receive new data elements every clock cycle. This greatly improves the overall data throughput of a design. If loops, implied feedback, for example, access to a shared resource such as a static field register, or another limiting resource exists in the LIM, the design still may be balanced, but new data only can be applied according to the limitation of that resource. An unbalanced design can only accept new data once the previous data set has been completed or run completely through the circuit.

After application of method 200, the LIM has been scheduled. Once the connections have been made, and optimizations have been applied, the resulting LIM can be translated into a target hardware description language. As the LIM is effectively a hierarchical netlist at this point in the process, the transformation of the LIM to a target hardware description language is readily performed.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A method of processing a general-purpose, high level language program to determine a hardware representation of the program, said method comprising:
    compiling the general-purpose, high level language program to generate a language independent model;
    examining execution characteristics of each component specified in the language independent model to determine an execution latency for each component;
    annotating the language independent model for generation of control signals such that each component is activated when both control and valid data arrive at the component;
    annotating each component with an output latency calculated from a latency of a control signal for the component and the execution latency of the component;
    identifying multiple copies of a structure comprising at least one component within the language independent model which can be re-used over multiple clock cycles as a shared resource;
    eliminating at least one copy of the shared resource; and
    annotating remaining copies of the shared resource for generating control signals and data signals to other components which interact with the copies of the shared resource.

2. The method of claim 1, further comprising:
    generating a hardware description language representation from the language independent model.

3. The method of claim 1, further comprising:
    determining whether a conflict exists between one or more other structures of the language independent model which access the shared resource; and
    if so, reconciling the conflict by inserting a register structure or by inserting an arbitration logic structure into the language independent model to regulate access to the shared resource.

4. The method of claim 1, further comprising:
    identifying a loop structure within the language independent model as a candidate for over-clocking, said loop structure comprising at least one component;
    over-clocking the identified loop structure; and
    adding a synchronization structure within the language independent model at the input and output of the over-clocked loop structure.

5. The method of claim 1, further comprising:
    identifying a loop structure within the language independent model as a candidate for multi-clocking, said loop structure comprising at least one component;
    multi-clocking the identified loop structure; and
    adding a synchronization structure within the language independent model at the input and output of the over-clocked loop structure.

6. The method of claim 1, further comprising:
    identifying a functional group of components in the language independent model which require at least a minimum area for hardware implementation or have a low throughput;
    designating the group of components for implementation as an embedded processor; and
    adding an interface structure to the language independent model comprising at least one component through which other components can interact with the embedded processor.

7. The method of claim 1, further comprising:
    including additional structures within the language independent model such that each data and control path through the language independent model requires a same number of clock cycles.

8. The method of claim 1, further comprising:
    assigning a complexity value to at least one component in the language independent model;
    determining a complexity value for component sequences between isolating structures of the language independent model; and
    for component sequences having a complexity value above a minimum value, inserting an additional isolating structure into the component sequence.

9. The method of claim 8, wherein the isolating structures are selected from the group consisting of a flip-flop and a register.

10. The method of claim 1, further comprising:
    assigning a target latency to the language independent model;
    assigning complexity values to components in the language independent model;
    determining a complexity value for component sequences between isolating structures of the language independent model;
    defining a number of zones within the language independent model equal to at least the target latency plus one, wherein each zone has approximately the same level of complexity as any other zone, and wherein control flows through each of the zones; and
    inserting isolating structures between each zone to achieve the target latency.

11. The method of claim 10, wherein the isolating structures are selected from the group consisting of a flip-flop and a register.

12. A machine-readable storage, having stored thereon a computer program having a plurality of code sections executable by a machine for causing the machine to perform the steps of:
    compiling the general-purpose, high level language program to generate a language independent model;
    examining execution characteristics of each component specified in the language independent model to determine an execution latency for each component;
    annotating the language independent model for generation of control signals such that each component is activated when both control and valid data arrive at the component;
    annotating each component with an output latency calculated from a latency of a control signal for the component and the execution latency of the component;
    identifying multiple copies of a structure comprising at least one component within the language independent model which can be re-used over multiple clock cycles as a shared resource;
    eliminating at least one copy of the shared resource; and
    annotating remaining copies of the shared resource for generating control signals and data signals to other components which interact with the copies of the shared resource.

13. The machine-readable storage of claim 12, further comprising:
generating a hardware description language representation from the language independent model.

14. The machine-readable storage of claim 12, further comprising:
determining whether a conflict exists between one or more other structures of the language independent model which access the shared resource; and
if so, reconciling the conflict by inserting a register structure or by inserting an arbitration logic structure into the language independent model to regulate access to the shared resource.

15. The machine-readable storage of claim 12, further comprising:
identifying a loop structure within the language independent model as a candidate for over-clocking, said loop structure comprising at least one component;
over-clocking the identified loop structure; and
adding a synchronization structure within the language independent model at the input and output of the over-clocked loop structure.

16. The machine-readable storage of claim 12, further comprising:
identifying a loop structure within the language independent model as a candidate for multi-clocking, said loop structure comprising at least one component;
multi-clocking the identified loop structure; and
adding a synchronization structure within the language independent model at the input and output of the over-clocked loop structure.

17. The machine-readable storage of claim 12, further comprising:
identifying a functional group of components in the language independent model which require at least a minimum area for hardware implementation or have a low throughput;
designating the group of components for implementation as an embedded processor; and
adding an interface structure to the language independent model comprising at least one component through which other components can interact with the embedded processor.

18. The machine-readable storage of claim 12, further comprising:
including additional structures within the language independent model such that each data and control path through the language independent model requires a same number of clock cycles.

19. The machine-readable storage of claim 12, further comprising:
assigning a complexity value to at least one component in the language independent model;
determining a complexity value for component sequences between isolating structures of the language independent model; and
for component sequences having a complexity value above a minimum value, inserting an additional isolating structure into the component sequence.

20. The machine-readable storage of claim 19, wherein the isolating structures are selected from the group consisting of a flip-flop and a register.

21. The machine-readable storage of claim 12, further comprising:
assigning a target latency to the language independent model;
assigning complexity values to components in the language independent model;
determining a complexity value for component sequences between isolating structures of the language independent model;
defining a number of zones within the language independent model equal to at least the target latency plus one, wherein each zone has substantially the same complexity as any other zone, and wherein control flows through each of the zones; and
inserting isolating structures between each zone to achieve the target latency.

22. The machine-readable storage of claim 21, wherein the isolating structures are selected from the group consisting of a flip-flop and a register.

* * * * *